(12) United States Patent
Dorn

(10) Patent No.: US 8,149,555 B2
(45) Date of Patent: Apr. 3, 2012

(54) SHORT-CIRCUIT CURRENT LIMITER

(75) Inventor: Jörg Dorn, Buttenheim (DE)

(73) Assignee: Siemens Aktiengesellschaft, Munich (DE)

( * ) Notice: Subject to any disclaimer, the term of this patent is extended or adjusted under 35 U.S.C. 154(b) by 421 days.

(21) Appl. No.: 12/440,249

(22) PCT Filed: Sep. 6, 2006

(86) PCT No.: PCT/DE2006/001586
§ 371 (c)(1),
(2), (4) Date: Mar. 6, 2009

(87) PCT Pub. No.: WO2008/028435
PCT Pub. Date: Mar. 13, 2008

(65) Prior Publication Data
US 2009/0262477 A1    Oct. 22, 2009

(51) Int. Cl.
*H02H 3/00* (2006.01)
(52) U.S. Cl. ............................. 361/103; 361/8
(58) Field of Classification Search .............. 361/8, 12, 361/103
See application file for complete search history.

(56) References Cited

U.S. PATENT DOCUMENTS

| 3,529,210 A | 9/1970 | Toshio et al. |
| 4,272,750 A | 6/1981 | Hotta et al. |
| 4,516,182 A * | 5/1985 | Franklin .......................... 361/13 |
| 5,999,388 A * | 12/1999 | Asplund .......................... 361/58 |

FOREIGN PATENT DOCUMENTS

| CN | 2459751 Y | 11/2001 |
| DE | 1638052 A1 | 3/1971 |
| DE | 19739551 A1 | 3/1999 |
| EP | 0642199 A1 | 3/1995 |
| JP | 55032680 U | 3/1980 |
| JP | 2003333860 A | 11/2003 |
| WO | 99135548 A1 | 3/1999 |

* cited by examiner

*Primary Examiner* — Danny Nguyen
(74) *Attorney, Agent, or Firm* — Laurence A. Greenberg; Werner H. Stemer; Ralph E. Locher

(57) ABSTRACT

In order to provide a power semiconductor module for power distribution and transmission, having a power semiconductor circuit which is connected via connecting lines to an energy storage device, which limits the current amplitudes that occur in the electrical fault and effectively protects the power electronics, it is proposed that the connecting lines have a weak point which breaks when the current load is above a threshold value, with the connecting lines furthermore having a resistance which is connected in parallel with the weak point.

13 Claims, 2 Drawing Sheets

SHORT-CIRCUIT CURRENT LIMITER

BACKGROUND OF THE INVENTION

Field of the Invention

The invention relates to a power semiconductor module for power distribution and transmission having a power semiconductor circuit which is connected via connecting lines to an energy store.

One such power semiconductor module is already known, for example, from GB 2 294 821 A. This document describes a so-called multilevel converter which comprises a series circuit formed by power semiconductor modules. Each power semiconductor module has an energy store which is connected to a power semiconductor circuit. In this case, the energy store is in the form of a capacitor and forms a so-called full-bridge circuit with the power semiconductors. Depending on the switch position of the power semiconductors, the positive capacitor voltage, the negative capacitor voltage or the voltage zero can be produced at the output of the power semiconductor module.

In the case of voltage intermediate-circuit converters, the power semiconductor circuit, or in other words the power electronics together with the power semiconductors, is normally connected with low inductance to the storage unit, for example an intermediate-circuit capacitor. In the event of a fault, for example if a power semiconductor breaks down, very high short-circuit current amplitudes can occur because of the ratio of the stray inductances and the intermediate-circuit capacitance, and these may even reach several hundred kiloamperes. As a consequence of this, certain power electronic components may suffer severe damage. For example, this can even lead to power semiconductor components exploding, with an arc being formed.

BRIEF SUMMARY OF THE INVENTION

The object of the invention is to limit the current amplitudes which occur in the event of a fault, and to effectively protect the power electronics or other components of a converter.

The invention achieves this object in that the connecting lines have a weak point which breaks when the current load exceeds a threshold value, wherein the connecting lines furthermore have a resistor which is connected in parallel with the weak point.

According to the invention, a weak point is provided between the energy store, for example a capacitor, and the power electronics which are particularly sensitive to said high currents. This weak point is designed such that it breaks down when there is an increased current flow through the weak point. In order to prevent the formation of an arc at the weak point, or at least to suppress it, a so-called bypass or shunt is provided in parallel with the weak point, an auxiliary current branch via which the current can flow after the weak point breaks, thus essentially preventing arc formation at the weak point. According to the invention, a resistor is provided in the auxiliary current branch. The short-circuit current therefore flows via the resistor. The resistor limits the short-circuit current, resulting in dissipated heat development. In this way, the current flow through the power semiconductors in the power semiconductor circuit is limited, and is gradually converted to heat by the resistor. If the current through the resistor cannot be limited to such an extent as to reliably prevent an arc being formed in the power semiconductor electronics, then it is critical according to the invention that the energy released in the arc of the power semiconductor is reduced in order either to avoid an explosion of the power semiconductor or in any case to weaken it to such an extent that damage to adjacent components is prevented.

By way of example, the expression current load should be understood as meaning the amplitude of the current flowing via the connecting lines and thus via the weak point. In this case, the weak point is designed such that, if the amplitude of said current exceeds a threshold current, the weak point breaks. In contrast to this, the threshold value may also be a defined energy loss or the like which is released at the weak point.

The weak point advantageously comprises an electrical conductor which melts when the energy loss at the weak point is greater than the threshold value. The electrical conductor therefore melts when the currents are high, thus resulting in the main current path being interrupted, with commutation onto the auxiliary current branch.

In contrast to this, the connecting lines have two electrical conductor sections which run parallel to one another and in which a discharge current of the capacitor flows in opposite senses, as a result of which repulsion forces are produced, wherein, if the current flow in said electrical conductor sections exceeds the threshold current, the repulsion forces result in the weak point breaking. According to this advantageous further development, use is made of the electrodynamic forces resulting from currents flowing in opposite senses in parallel conductor paths. In this case, one of the electrical conductor sections is expediently solid, while the other electrical conductor section is, for example, in the form of an area with a thin material thickness. In the event of high electromagnetic repulsion forces, which occur when high currents flow, the conductor path section in which the weak point is provided breaks open. The use of electrodynamic forces has the advantage that the forces are directly dependent on the current flow and therefore occur without any major time delay.

The weak point advantageously comprises an electrically conductive film. The film has a thickness which is adequate to carry the rated current but which should break or tear apart either as a result of mechanically acting repulsion forces or as a result of melting effects in the event of a short-circuit current.

In contrast to this, the weak point comprises an electrically conductive wire.

It is furthermore expedient for the power semiconductor circuit to have power semiconductors which can be turned off. Power semiconductors such as these which can be turned off have the advantage over power semiconductors which cannot be turned off, for example thyristors, that they can be switched on and switched off. This greatly increases the control capabilities of power semiconductors which can be turned off.

The power semiconductor circuit advantageously has bonded power semiconductors. Bonded power semiconductors are commercially available and generally comprise power semiconductor chips which are connected in parallel with one another and are connected to one another via wire links. Bonded power semiconductors cost less than comparable pressure-contact power semiconductors. However, they have the disadvantage that, in the event of a short circuit, the currents which flow via the wire links between the power semiconductor chips will destroy the wire links as a result of which an arc may be formed which destroys the power semiconductor and can result in an explosion of the housing. However, the invention limits the current flowing via the power semiconductors such that they can be used even for energy stores with a high storage capacity and high discharge currents, together with bonded power semiconductors. According to the invention, at least the energy released in an arc is reduced. So-called IGBTs, IGCTs, GTOs or the like may be used, for example, as power semiconductors. It is particularly preferable to use IGBTs.

The power semiconductor module according to the present invention advantageously has a first connecting terminal, a second connecting terminal, an energy store and a power semiconductor branch, which has two series-connected power semiconductors, connected in parallel with the energy store, wherein a freewheeling diode is connected back-to-back in parallel with each power semiconductor, and the junction point of the emitter of a first power semiconductor in the power semiconductor branch and the anode of the diode, which is connected in the opposite sense and is associated with the first power semiconductor, forms the first connecting terminal, and the junction point of the power semiconductors in the power semiconductor branch and the freewheeling diode forms the second connecting terminal. This circuit of power semiconductors is also referred to as a so-called Marquardt circuit and has switch positions in which the voltage dropped across the energy store or a zero voltage is produced at the connecting terminals.

In contrast to this, the power semiconductor module has a first connecting terminal, a second connecting terminal, an energy store and a power semiconductor branch, which has two series-connected power semiconductors and is connected in parallel with the energy store, wherein a freewheeling diode is connected back-to-back in parallel with each power semiconductor and the junction point of the collector of a first power semiconductor in the power semiconductor branch and the cathode of the freewheeling diode, which is connected in the opposite sense and is associated with the first power semiconductor, forms the first connecting terminal, and the junction point of the power semiconductor in the power semiconductor branch and the freewheeling diode forms the second connecting terminal. This is an alternative refinement of the Marquardt circuit, which has essentially the same characteristics.

The resistance is expediently greatly than 30 mΩ. This value range has been found to be expedient for applications in power transmission and distribution.

The connecting lines (18, 19) advantageously have a capacitor which is connected in parallel with the weak point. By way of example, the capacitor is provided in addition to the non-reactive resistance in order to even more reliably prevent the formation of an arc when the weak point breaks.

In addition to a power semiconductor module, the invention also relates to a converter valve branch for power distribution which has power semiconductor modules according to the present invention connected in series.

The invention also relates to a converter which is formed from converter valve branches according to the present invention, with the converter valve branches being connected to one another in a bridge circuit. In this case, two converter valve branches form a so-called phase module which is connected on both sides to a bipolar DC voltage circuit and, at the junction point between the converter valve branches, to an AC voltage power supply system.

The power semiconductor module according to the invention can, of course, also be used in conjunction with other applications. For example, the power semiconductor module according to the invention is also suitable for so-called flexible alternating current transmission systems, FACTS.

Further expedient refinements and advantages of the invention are the subject matter of the following description of exemplary embodiments of the invention, with reference to the figures of the drawing, in which the same components are provided with the same reference symbols, and in which:

DESCRIPTION OF THE INVENTION

Figure 1:
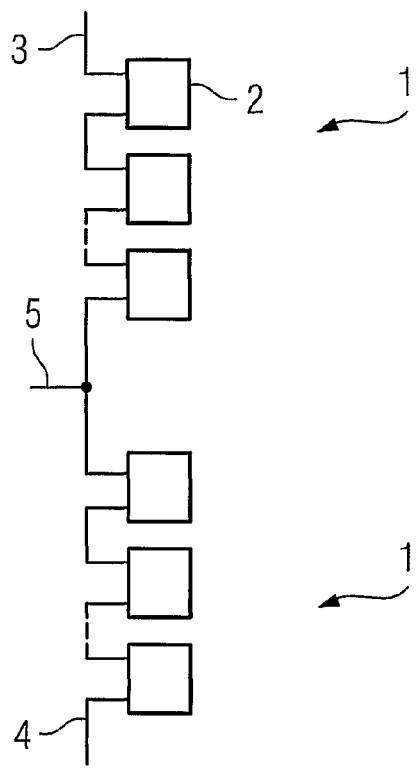
FIG. 1 shows one exemplary embodiment of converter valve branches according to the present invention.

FIG. 1 shows one exemplary embodiment of converter valve branches 1 according to the invention which each have power semiconductor modules 2 connected in series. Each power semiconductor valve branch 1 is equipped on one side with a DC voltage connection 3 or 4 and with an AC voltage connection 5 facing away from this. In the illustrated exemplary embodiment, the converter valve branches 1 are designed to be symmetrical, with the AC voltage connection 5 being arranged between the two valve branches. The AC voltage connection 5 is intended for connection to one phase of an AC voltage power supply system, which is not illustrated in the figure, via an inductance which is not illustrated in the figure. A converter, which is likewise not illustrated in the figure, is, for example, formed from a total of six converter valve branches 1, two of which are in each case connected in series with one another, as shown in FIG. 1, with the junction point of the converter valve branches in each case being connected to one phase of the AC voltage power supply system.

Figure 2:
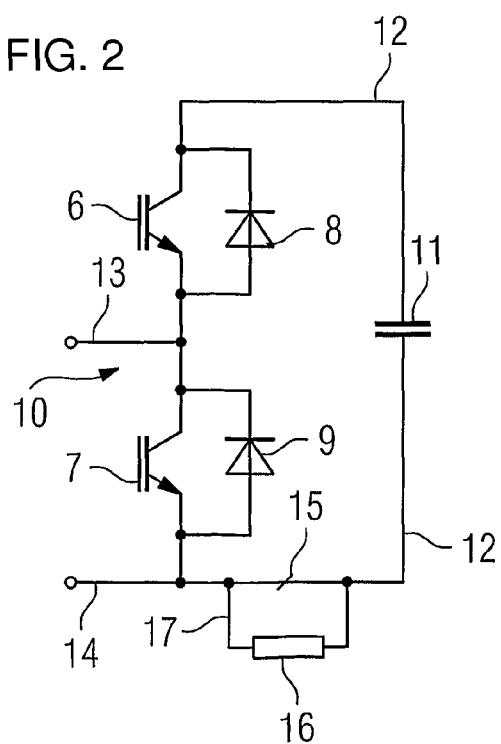
FIG. 2 shows an equivalent circuit of one exemplary embodiment of the power semiconductor module according to the invention.

FIG. 2 shows an equivalent circuit of the exemplary embodiment, which is illustrated only schematically in FIG. 1, of the power semiconductor module 2 according to the invention. The power semiconductor module 2 has two power semiconductors 6, 7 which are connected in series with one another, can be turned off and in the illustrated exemplary embodiments are in the form of so-called IGBTs. A respective freewheeling diode 8 or 9 is connected in parallel in the opposite sense to each respective power semiconductor 6 or 7. The power semiconductor branch 10 which comprises the power semiconductors 6, 7 connected in series is connected in parallel with a capacitor 11 as an energy store. The capacitor 11 is connected via connecting lines 12 to the power semiconductor electronics, which comprise the power semiconductors 6, 7, the diodes 8, 9 and drive electronics which are not shown.

The power semiconductor module 2 furthermore has two connecting terminals 13 and 14, with the connecting terminal 14 being connected to the emitter of the power semiconductor 7 as the first power semiconductor, and being connected to the anode of the diode 9 which is connected in the opposite sense. The second connecting terminal 13 is connected to the junction point of the power semiconductors 6, 7 and to the junction point of the respectively associated freewheeling diodes 8 and 9. When the power semiconductor 7 changes from its switched-off position to its switched-on position, the voltage which is dropped between the connecting terminals 13 and 14 is equal to zero. However, when the power semiconductor switch 7 is in a switched-off position, and the power semiconductor switch 6 is in a switched-on position, the voltage of the capacitor 11 is dropped between the connecting terminals 13 and 14.

In order to protect the power semiconductors 6 and 7 and the diodes 8 and 9, the connecting lines 12 have a weak point 15 which, in the exemplary embodiment illustrated in FIG. 2, is in the form of a melting wire. The weak point 15 is connected in parallel with a non-reactive resistor 16, with the non-reactive resistor 16 being arranged in a bridging branch 17. In the event of a short circuit, the capacitor 11 is suddenly discharged, thus resulting in an increased current flow via the connecting lines 12 and the melting wire 15. If the current flow through the melting wire 15 exceeds a threshold value, which is dependent on the thickness and the material of the melting wire, the melting wire melts, and the weak point 15 is thus broken. The current then flows via the bridging branch 17, and is limited by the non-reactive resistor 16. In this case, the non-reactive resistor 16 ensures dissipated conversion of the energy stored in the capacitor 11 to heat energy.

Figure 3:
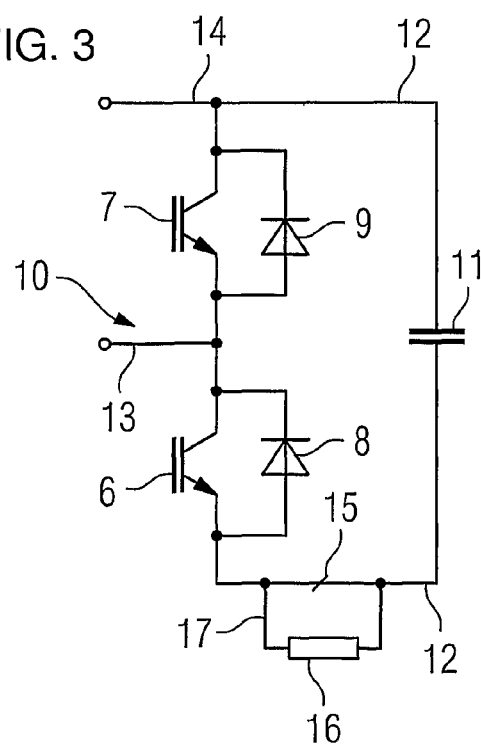
FIG. 3 shows an equivalent circuit of a further exemplary embodiment of the power semiconductor module according to the invention.

FIG. 3 shows an alternative refinement of the power semiconductor module 2 as shown in FIG. 2. In contrast to the variant of a Marquardt circuit as shown in FIG. 2, the first connecting terminal 14 in FIG. 3 is connected to the collector of the power semiconductor 7, which can be turned off, and to the cathode of the freewheeling diode 9 which is connected in the opposite sense to this. The second connecting terminal 13 is connected to the junction point of the power semiconductors 6, 7 and of the freewheeling diodes 8, 9. The exemplary embodiments of the Marquardt circuit shown in the figures are equivalent to one another, and therefore have the same characteristics.

Figure 4:
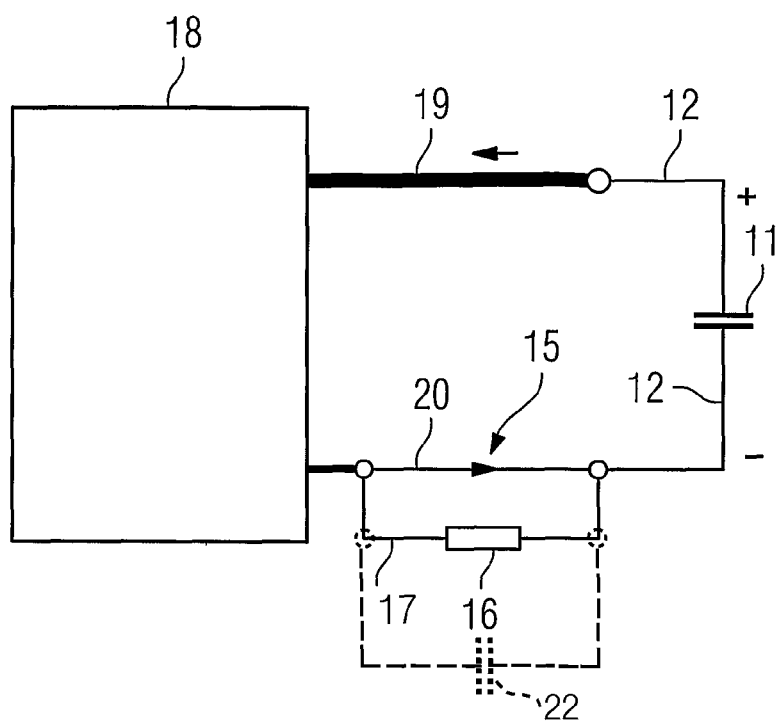
FIG. 4 shows an exemplary embodiment of the power semiconductor module according to the invention which may have a circuit as shown in FIG. 3 or 4.

FIG. 4 shows a further exemplary embodiment of a power semiconductor module 1 according to the invention, in which the power semiconductors are now illustrated only schematically as the power semiconductor circuit 18. In contrast to the exemplary embodiment illustrated in FIG. 2, the connecting lines 12 have, however, two electrical conductor sections 19, 20 which run parallel to one another and in which the current flows in opposite senses, as indicated by the arrows. The electrodynamic interactions lead to repulsion forces, although these do not cause the weak point 15 to break during normal operation. Only in the event of the fault do the current flow and therefore the repulsion forces arise sufficiently for the weak point 15 to break. In this case, the electrical conductor 19 is designed to be as solid as possible, for example in the form of a solid copper conductor, with the weak point 15 being a conductor with comparatively low mechanical strength.

Figure 5:
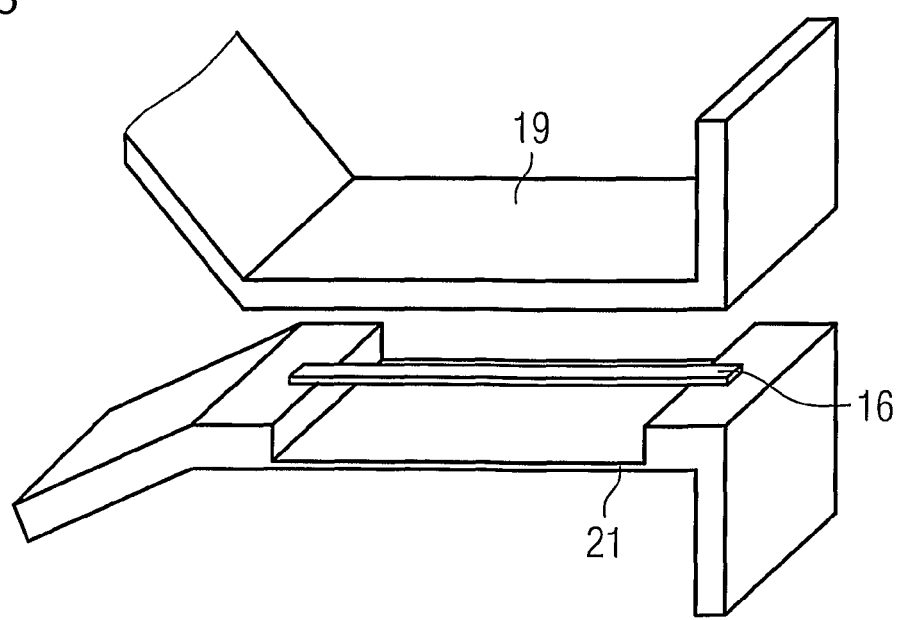
FIG. 5 shows a detail illustration of the power semiconductor module shown in FIG. 4.

FIG. 5 shows an enlarged view of the exemplary embodiment which is illustrated schematically in FIG. 3. In this case, the connecting conductor 19 which is illustrated at the top in FIG. 3 is in the form of a robust copper conductor which has an electrical conductor section which runs essentially in a straight line. A metal film 21, which is likewise straight, extends as a weak point parallel to and in the physical vicinity of the electrical conductor section of the connecting conductor 19. A non-reactive resistor in the form of a metal wire 16 is provided connected in parallel with the metal film 21. Current flows in opposite senses through the metal film 21 and the connecting conductor 19. High repulsion forces therefore occur in the event of a short circuit. This results in the metal film 21 being torn open, and in current flowing via the non-reactive resistor 16. A capacitor 22 may be connected in parallel with the weak point.

The invention claimed is:

1. A power semiconductor module for power distribution and transmission, comprising:
    a power semiconductor circuit connected via connecting lines to an energy storage device;
    said connecting lines having a weak point configured to break when a current load exceeds a given threshold value; and
    a resistor connected in parallel with said weak point in said connecting lines.

2. The power semiconductor module according to claim 1, wherein said weak point is an electrical conductor configured to melts when an energy loss at said weak point exceeds the given threshold value.

3. The power semiconductor module according to claim 1, wherein said connecting lines are formed with two electrical conductor sections running parallel to one another and conducting current flow in mutually opposite senses, causing repulsion forces to be produced, and wherein, when the current flow in said electrical conductor sections exceeds the given threshold current, the repulsion forces cause said weak point to break.

4. The power semiconductor module according to claim 1, wherein said weak point comprises an electrically conductive film.

5. The power semiconductor module according to claim 1, wherein said weak point comprises an electrically conductive wire.

6. The power semiconductor module according to claim 1, wherein said power semiconductor circuit has power semiconductors that can be turned off.

7. The power semiconductor module according to claim 1, wherein said power semiconductor circuit has bonded power semiconductors.

8. The power semiconductor module according to claim 1, which comprises:
    a first connecting terminal and a second connecting terminal;
    the energy storage device and a power semiconductor branch connected in parallel with said energy storage device and having two series-connected power semiconductors;
    a freewheeling diode connected anti-parallel with each said power semiconductor;
    wherein said first connecting terminal is formed by a node of an emitter of a first said power semiconductor in said power semiconductor branch and an anode of said freewheeling diode connected in an opposite sense and associated with said first power semiconductor; and
    wherein said second connecting terminal is formed by a node between said power semiconductors in said power semiconductor branch and said freewheeling diode.

9. The power semiconductor module according to claim 1, which comprises:
    a first connecting terminal and a second connecting terminal;
    the energy storage device and a power semiconductor branch connected in parallel with said energy storage device and having first and second series-connected power semiconductors;
    a freewheeling diode connected anti-parallel with each said power semiconductor;
    wherein said first connecting terminal is formed by a node of a collector of said first power semiconductor in said power semiconductor branch and a cathode of said freewheeling diode, which is connected in an opposite sense and is associated with said first power semiconductor; and wherein said second connecting terminal is formed by a node of said power semiconductors in said power semiconductor branch and said freewheeling diode.

10. The power semiconductor module according to claim 1, wherein said resistor has a resistance value greater than 30 mΩ.

11. The power semiconductor module according to claim 1, wherein said connecting lines include a capacitor connected in parallel with said weak point.

12. A converter valve branch, comprising a series circuit formed of a plurality of power semiconductor modules each according to claim 1 and connected in series.

13. A converter, comprising a plurality of converter valve branches connected in a bridge circuit formed and each including a series circuit of a plurality of power semiconductor modules each according to claim 1 and connected in series.

* * * * *